(12) United States Patent
Gersten et al.

(10) Patent No.: US 12,352,805 B2
(45) Date of Patent: Jul. 8, 2025

(54) SYSTEM AND METHOD FOR TESTING IOT TAGS

(71) Applicant: Wiliot, LTD., Caesarea (IL)

(72) Inventors: Eylon Gersten, Even Yehuda (IL); Michael Maor, Tel-Aviv (IL); Dmitry Bravshtein, Tzofim (IL)

(73) Assignee: Wiliot, LTD., Caesarea (IL)

( * ) Notice: Subject to any disclaimer, the term of this patent is extended or adjusted under 35 U.S.C. 154(b) by 54 days.

(21) Appl. No.: 17/465,366

(22) Filed: Sep. 2, 2021

(65) Prior Publication Data

US 2022/0082610 A1 Mar. 17, 2022

Related U.S. Application Data

(60) Provisional application No. 63/079,702, filed on Sep. 17, 2020.

(51) Int. Cl.
G01R 31/28 (2006.01)
G06K 7/10 (2006.01)
G06K 19/07 (2006.01)
G06K 19/077 (2006.01)
H04B 5/20 (2024.01)
H04B 5/45 (2024.01)
H04B 5/77 (2024.01)
H04B 17/29 (2015.01)
H04B 17/318 (2015.01)

(52) U.S. Cl.
CPC ..... *G01R 31/2822* (2013.01); *G06K 7/10336* (2013.01); *G06K 19/0723* (2013.01); *G06K 19/07783* (2013.01); *H04B 5/20* (2024.01); *H04B 5/45* (2024.01); *H04B 5/77* (2024.01); *H04B 17/318* (2015.01); *H04B 17/29* (2015.01)

(58) Field of Classification Search
CPC ........... G01R 31/2822; G06K 19/0723; G06K 19/07783; G06K 7/10336; G06K 7/10435; H04B 17/318; H04B 5/0031; H04B 5/0056; H04B 5/0062; H04B 17/29
See application file for complete search history.

(56) References Cited

U.S. PATENT DOCUMENTS 6,104,291 A * 8/2000 Beauvillier .......... G08B 13/244
340/572.1
7,154,283 B1 * 12/2006 Weakley ............... G06K 7/0095
340/572.1
7,279,920 B2 10/2007 Kramer
(Continued)

*Primary Examiner* — Farhana A Hoque
*Assistant Examiner* — Joseph O Nyamogo
(74) *Attorney, Agent, or Firm* — M&B IP Analysts, LLC

(57) ABSTRACT

A system and a method for testing a wireless tag that has an antenna for wireless communication and employs a low energy wireless communication protocol. The system includes a near field antenna; and a fixture for positioning the wireless tag to be tested so that the at least one antenna for wireless communication of the at least one wireless tag to be tested is within a near field of the near field antenna of the system; wherein when the wireless tag is positioned by the fixture, it is within an at least a partly open chamber. The method comprises supplying, via the near field antenna of the system, a test signal for receipt by the antenna of the wireless tag; and comparing a received signal strength of a response from the wireless tag in response to the test signal to an expected benchmark.

20 Claims, 5 Drawing Sheets

(56) References Cited

U.S. PATENT DOCUMENTS

| | | |
|---|---|---|
| 7,400,255 B2 | 7/2008 | Horch |
| 7,528,724 B2 | 5/2009 | Horch |
| 8,797,146 B2* | 8/2014 | Cook ............... G06K 19/07749 340/10.34 |
| 9,016,585 B2 | 4/2015 | Pavate et al. |
| 2005/0180380 A1* | 8/2005 | Friedrich ............. G06K 7/0008 370/349 |
| 2006/0145710 A1* | 7/2006 | Puleston ............. G06K 7/0008 702/182 |
| 2006/0206277 A1 | 9/2006 | Horch |
| 2006/0226983 A1* | 10/2006 | Forster ................ G06K 7/0008 340/572.1 |
| 2009/0085589 A1 | 4/2009 | Hsieh et al. |
| 2013/0267173 A1* | 10/2013 | Ling ....................... H04B 5/72 455/41.1 |

\* cited by examiner

SYSTEM AND METHOD FOR TESTING IOT TAGS

CROSS-REFERENCE TO RELATED APPLICATIONS

This application claims benefit of U.S. provisional patent application Ser. No. 63/079,702 filed Sep. 17, 2020, which is incorporated herein by reference.

TECHNICAL FIELD

The present disclosure relates generally to low energy devices and more specifically to testing such low energy devices to determine their functionality.

BACKGROUND

Bluetooth® and Bluetooth low energy (BLE) are personal area network protocols that support wireless connectivity over the 2.4 GHz industrial, scientific, and medical (ISM) band to distances even more than 250 meters. A BLE signal is used with low power consumption devices, such as battery-less Internet of things (IoT) tags. Bluetooth and Bluetooth low energy communication operate in far field and their protocol can support multiple connections and multiple device connectivity at the same time. Other low energy communication protocols includes LoRa, nRF, DECT® Ultra Low Energy (DECT ULE), Zigbee®, Z-Wave®, EnOcean®, and the like can be used for tags in a similar manner to Bluetooth and BLE. For simplicity and pedagogical purposes, this disclosure will use BLE as an illustrative example, although the disclosure is applicable to tags and testers that employ such other low energy communication protocols.

Some BLE devices may include an Advanced RISC Machines (ARM) processor with at least one or more antennas patterned or designed for transmitting (TX) and receiving (RX) data via radio frequency (RF) communication signals. Additional one or more antennas and other components may be included for use in harvesting energy, e.g., RF energy harvesting, to power the tag's operation. In other configurations, one or more antennas can be used for both harvesting and TX and/or RX. Energy harvesting allows a tag to operate without requiring a battery source or other external power supply by using over-the-air signals to charge a capacitor.

BLE low-cost tags are initially implemented as single tags or on reels, very similar to what is commonly used in radio frequency identification (RFID) tags. The BLE tag's substrate are usually made of PET, PI, or other flexible material and the antenna design is commonly applied/made with copper, aluminum or silver metals.

Currently BLE devices are tested to ensure that they perform as expected either by a) using a conductive testing method in which a direct electrical connection is established between a testing fixture and a portion, e.g., the antenna, of the tag being tested, or b) using far-field over the air, i.e., radio communication, in a sealed radio frequency (RF) chamber. Disadvantageously, when testing using the conductive method, the full RF path is not tested. Also, when running far-field over the air testing, disadvantageously, multiple tags may response due to the high sensitivity of the BLE receivers in each tag. In other words, in such far-field over the air testing there is no control over which specific device responds which can be especially problematic when the devices are arranged on reels and are thus relatively closely spaced.

The testing can be performed in either a static or a dynamic mode. In the static mode, the tags being tested are stationary, where a testing probe may or may not move relative to the tags. Often in this mode multiple tags are tested simultaneously. In the dynamic mode, the tags, being incorporated, for example into a roll or reel, are placed on a moving surface, such as a conveyer belt, and are transported along the belt so that the tags move relative to the testing probe. The tags may be moved at a specific speed, or, alternatively, the tags may be transported in a so-called "step and hold" mode. The speed at which the tags are moved may be varied depending on the response of the tag. Multiple tags can be tested simultaneously. The functionality of the tags must be determined to ensure that the tag functions as intended, e.g., with an outcome of the test as either a pass or a fail.

The tags are generated at a mass-production level, thus requiring that the testing of such tags be performed accurately at scale within acceptable time constraints.

It would therefore be advantageous to provide a solution that would overcome the challenges noted above.

FIG. 2 is a schematic diagram of a prior art tester 200 configured to test the functionality of an IoT tags, e.g., an IoT tag 250. The tested IoT tags e.g., an IoT tag 250 are battery-free IoT tags which perform energy harvesting, e.g., harvesting energy from wireless signals impacting thereon.

The tester 200 is configured to determine if an IoT tag 250 operates as expected, and may be integrated within a machine that assembles IoT tags. Such assembling includes metal etching, e.g., copper and aluminum, placing, and attaching the device using Anisotropic Conductive Past (ACP) to the antennas with the integrated circuits on the inlay of an IoT tag 250. The tester 200 may operate as part of a static or a dynamic testing procedure.

The tester 200 includes a transmitter/receiver (TX/RX) 210 connected to a transmitting/receiving antenna 215. The TX/RX 210 is further connected to a microcontroller (MC) 230.

The TX/RX 210 is configured to transmit harvesting signals to an IoT tag 250, where the IoT tag 250 is configured to use the harvesting signal to charge a capacitor using the harvesting antennas of the IoT tag 250. The harvesting signals transmitted by the transmitting/receiving antenna 215 may include any wireless signals that the tag can harvest, and may include wireless signals such as BLE®, FM radio, cellular, Bluetooth®, LoRa, Wi-Fi®, nRF, DECT®, Zigbee®, Z-Wave®, EnOcean®, and the like. The signals that IoT tag 250 may harvest need not be of the same type that IoT tag 250 uses for communication.

The TX/RX 210 may be configured to transmit multiple different signals, e.g., a BLE signal and an FM radio signal, simultaneously to one or more IoT tags 250. Where the TX/RX 210 is configured to transmit signals at different bands, the TX/RX 210 may receive instructions from the microcontroller 230 indicating which type of signal is to be transmitted to one or more IoT tags, and the timeframe in which they are transmitted.

The tester 200 may be configured to transmit signals with different frequencies to adjacent IoT tags (not shown in FIG. 2). For example, if multiple IoT tags 250 are being tested at the same time, adjacent IoT tags are each sent unique signals from the TX/RX 210 to minimize residual signals which may cause interference and inaccurate testing results caused by transmitted signals intended for the testing of a different tag.

The tester 200 may be configured to test several harvesting antennas connected to a single storage capacitor individually, where the transmission of an RF harvesting signal and the measurement of a capacitor charging time is performed one antenna at a time. The several harvesting antennas may belong to a single IoT tag 250 or to multiple IoT tags 250.

The TX/RX 210 is configured to send a timestamp to the microcontroller 230 identifying when each of the transmitted signals is sent to the IoT tag 250. This timestamp is identified as $T_1$. The TX/RX 210 may be further configured to confirm the type of signal sent to the IoT tag 250 by sending a confirmation message to the microcontroller 230 identifying the type of signal sent, e.g., the power of a signal and the exact frequency used.

The TX/RX 210 is configured to receive a BLE signal, e.g., a BLE packet, sent from the IoT tag 250 and determine a time of receipt, identified as $T_2$. Such a packet may be received over a BLE advertising channel. The IoT tag 250 is configured such that a response signal, i.e., the BLE signal, is transmitted from the IoT tag 250 to the tester 200 when the capacitor is charged to a sufficient level to power the transmission itself.

The charging time of the capacitor to reach such a level is defined as $T_2$-$T_1$, and is determined by the microcontroller 230. The charging time may be used to determine if the IoT tag 250 operates within target parameters. Such parameters include a charging time at a predetermined value and data rate after receiving the first packet, or within a set range of a predetermined value. If so, the microcontroller 230 assigns a pass value to the IoT tag 250, e.g., within a database or within the tag itself. If not, a fail value is assigned to the tag.

For example, if the predetermined value is 1 second and the data rate is 10 Hz, a pass indication will be assigned to a tag if the BLE response signal is sent back within 1 second of the transmitted signal, thus indicating that the capacitor is configured to sufficiently charge, and the data rate is equal or more than 10 Hz within that timeframe to allow for transmission of a BLE signal. If it takes longer to harvest the energy and transform sufficient power to transmit a response signal and data rate, the tag is deemed to have failed the test. In a further embodiment, a range of an acceptable timeframe, e.g., 0.75-1.5 seconds and a data rate of 10-20 Hz, qualifies a tag for a pass assignment.

Rather than simply testing for the receipt of the BLE signal sent from the IoT tag 250 in response to charging of the capacitor in the tag, it may be desired to have a more complex communication interaction take place between tester 200 and IoT tag 250 before qualifying the tag for a pass assignment. Such a more complex communication interaction could, for example, be used to verify additional sections of IoT tag 250.

As IoT tag 250 in the arrangement of FIG. 2 is located in the far field with respect to transmitting/receiving antenna 215, other IoT tags besides IoT tag 250 may be within the far field. Such other tags may receive the harvesting energy and/or hear messages transmitted from tester 200 along with IoT tag 250. Consequently, the other tags may respond to the harvesting energy and/or messages, which results in overlapping responses that cannot be properly discerned by tester 200. The far field for the BLE frequency band is in the range of ~60 cm when using a small antenna, e.g., 5 times the BLE wavelength, where the wavelength at 2.4 Ghz is around ~12 cm.

Tester 200 may be configured to test the antenna of IoT tag 250 transmission, where the RF receiver of the tester 200 is configured to measure input power received from the TX signal sent by the IoT tag 250. As an example, the TX signal can be a BLE frame, a CW signal, and the like. The advantage of having an IoT tag 250 send a TX packet is that the packet can include a tag ID. Tester 200 can easily determine the order of the tag IDs, and use the order to filter out tag signals originating from nearby tags using residual energy.

Tester 200 may be configured to compare the received signal strength to an expected benchmark, and assign a 'pass' only to tags that meet or exceed that benchmark, e.g., using a received signal strength indicator (RSSI) parameter for example. Tester 200 can additionally check for frequency offsets from a nominal value.

Tester 200 may be configured to cause the IoT tag 250 to acknowledge successful receipt of data by programming the test result in its nonvolatile memory (NVM). If such programming fails, tester 200 may be configured to fail the IoT tag. Failed tags are marked and cataloged as such, e.g., in an external source. Further, the external source can remove such tags from a white list of allowed tags.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include a system for testing a wireless tag that has at least one antenna for wireless communication and employs at least one low energy wireless communication protocol. The system comprises: a near field antenna; and a fixture for positioning the wireless tag so that the at least one antenna for wireless communication of the wireless tag is within a near field of the near field antenna of the system; wherein when the wireless tag is positioned by the fixture, the wireless tag is within an at least a partly open chamber.

Certain embodiments disclosed herein also include a system for performing dynamic testing of one or more wireless tags each of which has at least one antenna for wireless communication and employs at least one low energy wireless communication protocol The system comprises: a near field antenna; and a moving surface for positioning each of the wireless tags to be tested so that the at least one antenna for wireless communication of the wireless tag to be tested is positioned to be within a near field of the near field antenna of the system; wherein, when the wireless tag to be tested is positioned by the moving surface to be within the near field of the near field antenna of the system, the wireless tag to be tested is within an at least a partly open chamber.

Certain embodiments disclosed herein also include a method for use in connection with a system for testing at least one wireless tag that has at least one antenna for wireless communication and employs at least one low energy wireless communication protocol, the system having a near field antenna; and a fixture for positioning the at least one wireless tag to be tested so that the at least one antenna for wireless communication of the at least one wireless tag to be tested is within a near field of the near field antenna of the system; wherein when the wireless tag to be tested is positioned by the fixture, the wireless tag is within an at least a partly open chamber. The method comprises supplying, via the near field antenna of the system, a test signal for receipt by the at least one antenna of the wireless tag; and comparing a received signal strength of a response from the wireless tag in response to the test signal to an expected benchmark.

BRIEF DESCRIPTION OF THE DRAWING

The foregoing and other objects, features, and advantages of the disclosed embodiments will be apparent from the following detailed description taken in conjunction with the accompanying drawings.

DETAILED DESCRIPTION

Figure 1:
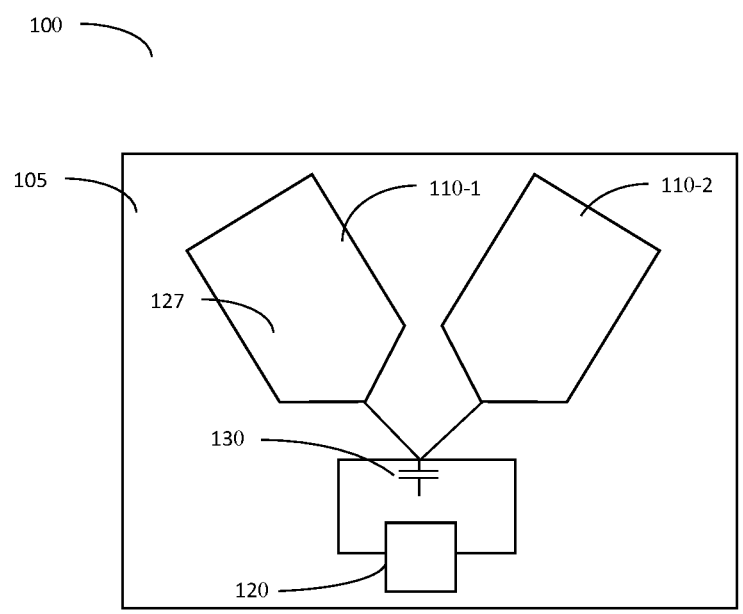
FIG. 1 is a schematic diagram of an illustrative IoT tag.

The embodiments disclosed by the invention are only examples of the many possible advantageous uses and implementations of the innovative teachings presented herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Problems with testing wireless devices, e.g., wireless tags, that employ protocols such as Bluetooth, BLE, and other low energy wireless communication protocols, can be mitigated by apparatus for testing such a tag that has at least one antenna for wireless communication, wherein the testing apparatus comprises a near field antenna and a fixture for positioning the device to be tested so that the at least one antenna for wireless communication of the device to be tested is within the near field of the near field antenna; and wherein when the wireless device to be tested is positioned by the fixture, it is within an at least a partly open chamber.

FIG. 1 is a schematic diagram of an illustrative IoT tag 100 utilized with the various embodiments for testing such IoT tags. The IoT tag 100 includes an integrated circuit (IC, or chip) 120 and at least one antenna 110-1, 110-2 placed on an inlay 105. In an embodiment, the inlay 105 is a single layer inlay that includes the integrated circuit 120 connected to the at least one antenna 110-1, 110-2 and may be mounted on a substrate (not shown). The substrate is a single layer material, which may be a single metal layer or any appropriate integrated circuit mounting material, such as a printed circuit board (PCB), silicon, flexible printed circuits (FPC), low temperature co-fired ceramic (LTCC), polyethylene terephthalate (PET), Polyimide (PI), paper, and the like.

In an example embodiment, the IoT tag 100 includes a pair of antennas 110-1 and 110-2 that are etched within the inlay 105. The first antenna 110-1 is utilized to harvest energy from ambient RF signals and the second antenna 110-2 is utilized to communicate, e.g., transmit and receive, signals, such as Bluetooth Low Energy (BLE) signals. Each antenna 110-1, 110-2 may be of a type including a loop antenna, a big loop with two feeds, a dipole antenna with two transformer feeds, and similar configurations. It should be noted that the transmitting antenna 110-2 may be utilized to harvest energy as well. Further, in some configurations, a plurality of antennas may be used to harvest energy, each of which is designed to receive signals of different frequencies.

In an embodiment, the IoT tag 100 also includes a capacitor 130 that may be realized as an on-die capacitor, an external passive capacitor, and the like. The energy harvesting functionality is performed by the integrated circuit 120.

In order to ensure that the IoT tag 100 can operate accurately, the harvesting frequency of the harvesting antenna 110-1 should be tested to determine if it falls within acceptable parameters that enable charging of the capacitor 130 within a predetermined timeframe. In an embodiment, the testing requires determining if each individual IoT tag 100 is capable of receiving signals, harvesting energy, charging a capacitor, and sending signals.

Because the IoT tag 100 is often configured to operate efficiently using a minimal amount of power available from energy harvesting, the effective operating frequency range of the IoT tag 100 is limited. Determining if a tag operates successfully within a set frequency range is crucial in evaluating whether a particular tag is capable of performing as desired.

The harvesting antenna 110-1 of the IoT tag 100 receives energy over RF signals at one or more frequency bands. Such bands are specific to the parameters of that tag, which include, but are not limited to, physical parameters such as antenna length, thickness, conductivity, resistivity, and antenna properties, such as gain, radiation pattern, beam width, polarization, impedance, and the like. It should be noted that even minute differences or shifts between the parameters of two antennas may result in a different harvesting frequency.

Based on the harvesting frequency, the harvesting antenna 110-1 of an IoT tag 100 is tuned to a frequency band where the IoT tag can most efficiently receive and transform RF signals received over that band into a DC voltage. In an embodiment, the DC voltage is stored on the capacitor 130, or on a similar power storage device.

The energy E on the capacitor 130 is related to the DC voltage V by the following equation: $E=1/2CV^2$, where C is the capacitance of the capacitor. As discussed above, the inlay 105 of the IoT tag 120 may include multiple antennas, where more than one antenna may be configured as a separate harvester. In an embodiment, each harvester is connected to a separate storage capacitor, while in a further embodiment, a single storage capacitor is common to multiple harvesters, allowing for an increased shared storage capacity for the IoT tag 100.

Figure 3:
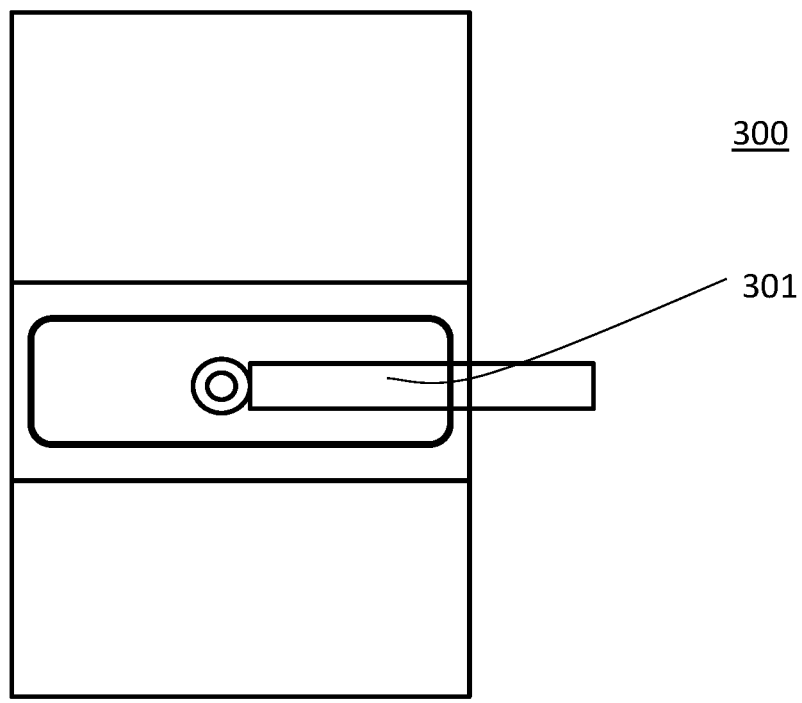
FIG. 3 shows an embodiment of a tester that avoids the difficulties of the prior art tester.

FIG. 3 shows an embodiment of a tester 300 that avoids the difficulties of the prior art tester 200 by performing the testing when communication antenna 110-2 of IoT tag 100 is within the near field of antenna 301. In some embodiments, antenna 301 is configured to specifically be a near field antenna. During the testing, antenna 301 is arranged to be near or under IoT tag 100. Near field antenna 301 is used to both energize and communicate with our IoT 100 in order to test it.

Figure 2:
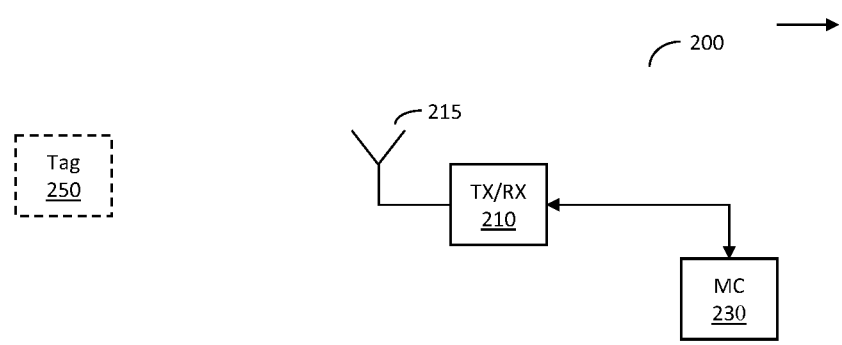
FIG. 2 is a schematic diagram of a prior art tester configured to test the functionality of IoT tags.

In one embodiment, near field antenna 301 and IoT 100 are placed quite close to each other during the testing. Although this is not shown in FIG. 3, it can be seen in FIGS. 4 and 5, and as described hereinbelow. Reducing the distance and power as much as possible helps to avoid neighbor or nearby tags inadvertently also communicating with the tester 300 and thus interfering with the testing. In one illustrative embodiment, near field antenna 300 and IoT 100 are less than ~3 cm apart. In embodiments, testing of IoT tag 100 in the near field of antenna 300 enables prediction of the behavior of IoT tag 100 when deployed in the far field of a unit with which it is to communicate with when deployed in the field. Advantageous, the near filed approach enables using lower power and smaller size testing infrastructure than is otherwise needed, e.g., as in FIG. 2. Furthermore, in embodiments of the invention the full radio frequency (RF) path may be tested.

Figure 4:
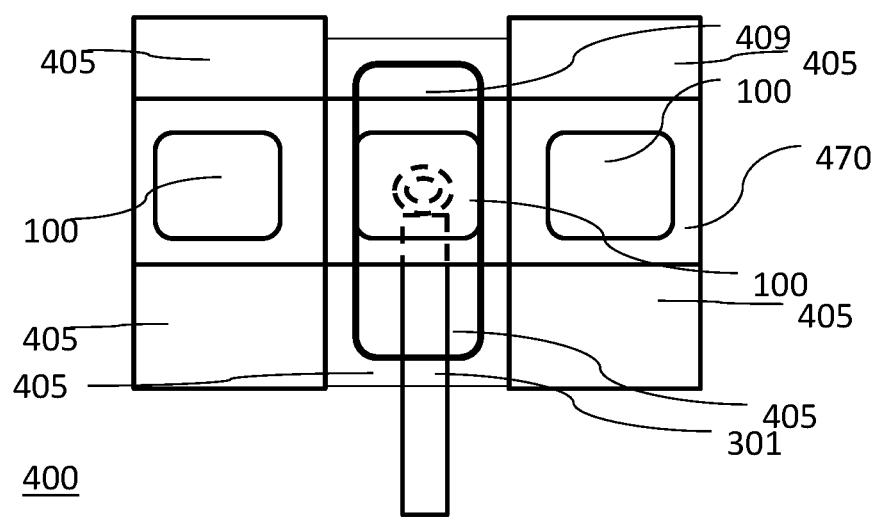
FIG. 4 shows an arrangement which allows for the dynamic testing of IoT tags using the tester of FIG. 3.

FIG. 4 shows arrangement 400 which allows for the dynamic testing of IoT tags 100 using tester 300. Dynamic testing involves testing IoT tags 100 as they pass close to near field antenna 301. In an embodiment, dynamic testing includes placing multiple cured IoT tags 100 on a moving surface 470, such as a conveyor belt, where they pass by near field antenna 301. For example, as each IoT tag 100 passes over near field antenna 301 it is tested. In this embodiment, tester 300 is configured to synchronize the test flow based on analyzing the charging times of a capacitor and the data rate.

Figure 5:
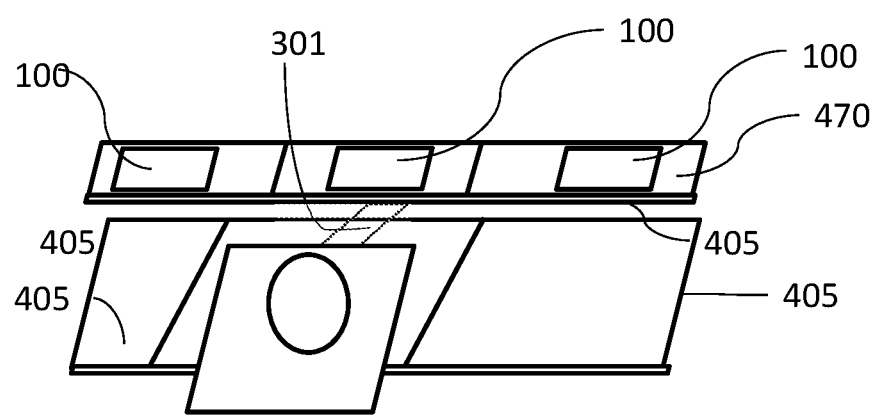
FIG. 5 provides a perspective view of the arrangement of FIG. 4.

Note that because the testing is being done in the near field, the testing need not be done in a fully shielded environment, as can be seen from FIGS. 4 and 5. FIG. 4 shows various shielding portions 405, which are made of conductive metal, which form a partially closed chamber around near field antenna 301. An opening in the chamber 409 formed by the various shielding portions is such that radio waves can pass from near field antenna 301 to IoT tag 100 that is under test, e.g., directly over near field antenna 101. In embodiments of the invention, conveyor belt is not conductive so as to minimize interference of the communication between near field antenna 301 with IoT tag 100. A controller (not shown) may synchronize the movement of moving surface 470 and the testing process, e.g., the signals transmitted by near field antenna 301.

FIG. 5 provides a perspective view of arrangement 400 of FIG. 4.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A system for testing operationality of a battery-free wireless tag that has at least one antenna for far field wireless communication and employs at least one low energy wireless communication protocol, the system comprising:
   a near field antenna; and
   a fixture for positioning the wireless tag so that the at least one antenna for far field wireless communication of the wireless tag is within a near field of the near field antenna of the system;
   wherein when the wireless tag is positioned by the fixture, the wireless tag is within an at least a partly open chamber;
   wherein the entirety of the testing of the wireless tag is performed when the at least one antenna for far field wireless communication of the wireless tag is within a near field produced by the near field antenna of the system;
   wherein during testing, in order to test the wireless tag the near field antenna of the system is used to both transmit a wireless signal supplying operating energy to the wireless tag and to communicate with the wireless tag; and
   wherein a pass result for the wireless tag requires the system to receive a message from the wireless tag in conformance with the at least one low energy wireless communication protocol within a specified time range after the system transmits the wireless signal supplying operating energy to the wireless tag.

2. The system as defined in claim 1, wherein the testing of the wireless tag within a near field produced by the near field antenna of the system is indicative of expected behavior of the wireless tag when it is deployed in a far field of a unit with which it is to communicate under operating conditions whereby testing of the wireless tag in the far field is obviated.

3. The system as defined in claim 1 wherein a full radio frequency (RF) path of the wireless tag is tested while the wireless tag is within a near field produced by the near field antenna of the system.

4. The system as defined in claim 1, wherein the chamber is at least partly open when testing is performed.

5. The system as defined in claim 1, wherein a pass result for the wireless tag further requires the system to receive a message acknowledging successful receipt of data by the wireless tag by programming the test result in its nonvolatile memory.

6. The system as defined in claim 1, wherein, during testing, the near field antenna of the system and the wireless tag are less than 3 cm apart.

7. A system for performing dynamic operationality testing of one or more wireless tags each of which has at least one antenna for far field wireless communication and employs at least one low energy wireless communication protocol, the system comprising:
a near field antenna; and
a moving surface for positioning each of the wireless tags to be tested so that the at least one antenna for far field wireless communication of the wireless tag to be tested is positioned to be within a near field of the near field antenna of the system;
wherein, when the wireless tag to be tested is positioned by the moving surface to be within the near field of the near field antenna of the system, the wireless tag to be tested is within an at least a partly open chamber; and
wherein the entirety of the testing of the wireless tag is performed when the at least one antenna for far field wireless communication of the wireless tag is within a near field produced by the near field antenna of the system;
wherein during testing, in order to test the wireless tag the near field antenna of the system is used to both transmit a wireless signal supplying operating energy to the wireless tag and to communicate with the wireless tag; and
wherein a pass result for the wireless tag requires the system to receive a message from the wireless tag in conformance with the at least one low energy wireless communication protocol within a specified time range after the system transmits the wireless signal supplying operating energy to the wireless tag.

8. The system as defined in claim 7 wherein the moving surface is substantially not conductive.

9. The system as defined in claim 7, wherein the near field antenna is located below the moving surface.

10. The system as defined in claim 7, wherein the moving surface is a conveyor belt.

11. The system as defined in claim 7, wherein the system further comprises the partly open chamber.

12. The system as defined in claim 7, wherein each tag being tested is tested when the at least one antenna for wireless communication of the tag being tested is moved by the moving surface to be located within a near field produced by the near field antenna of the system.

13. The system as defined in claim 12, wherein the testing of each respective one of the wireless tags when tested within a near field produced by the near field antenna of the system is indicative of expected behavior of the respective wireless tag when it is deployed in a far field of a unit with which it is to communicate under operating conditions whereby testing of the wireless tag in the far field is obviated.

14. The system as defined in claim 12, wherein a full radio frequency (RF) path of each wireless tag being tested is tested while each wireless tag is within a near field produced by the near field antenna of the system.

15. The system as defined in claim 7, further comprising a processor, the processor controlling t movement of the moving surface to be coordinated with the testing of each of the tags sequentially.

16. The system as defined in claim 15, wherein the processor controls t movement of the moving surface and the testing of each of the tags based on an analysis of a charging time of a capacitor of at least one of the tags and data rate for communication supported by at least one of the tags.

17. The system as defined in claim 16, wherein the capacitor is used to provide operating energy for the wireless tag.

18. The system as defined in claim 7, wherein, during testing, the near field antenna and the wireless tag to be tested are less than 3 cm apart.

19. A method for use in connection with a system for testing operationality of at least one wireless tag that has at least one antenna for far field wireless communication and employs at least one low energy wireless communication protocol, the system having:
a near field antenna for transmitting a wireless signal supplying operating energy to the wireless tag and to communicate with the wireless tag and for and communicating with the wireless tag; and
a fixture for positioning the at least one wireless tag to be tested so that the at least one antenna for far field wireless communication of the at least one wireless tag to be tested is within a near field of the near field antenna of the system;
wherein when the wireless tag to be tested is positioned by the fixture, the wireless tag is within an at least a partly open chamber;
the method comprising:
transmitting, by the near field antenna, the wireless signal supplying operating energy to the wireless tag;
supplying, via the near field antenna of the system, a test signal in accordance with the at least one low-energy wireless communication protocol for receipt by the at least one antenna for far field wireless communication of the wireless tag; and
comparing a received signal strength of a response from the wireless tag in response to the test signal to an expected benchmark;
wherein the entirety of the testing of the wireless tag is performed when the at least one antenna for wireless communication of the wireless tag is within a near field produced by the near field antenna of the system; and
wherein a pass result for the wireless tag requires the system to receive a message from the wireless tag in conformance with the at least one low energy wireless communication protocol within a specified time range after the system transmits the wireless signal supplying operating energy to the wireless tag.

20. The method as defined in claim 19, wherein the method further comprises sequentially positioning each of a plurality of wireless tags as the at least one wireless tag.

* * * * *